(12) United States Patent
Hsieh

(10) Patent No.: US 12,158,482 B2
(45) Date of Patent: Dec. 3, 2024

(54) PROBE CARD ASSEMBLY

(71) Applicant: MEDIATEK INC., Hsinchu (TW)

(72) Inventor: Tung-Hsien Hsieh, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 331 days.

(21) Appl. No.: 17/509,347

(22) Filed: Oct. 25, 2021

(65) Prior Publication Data
US 2022/0196706 A1 Jun. 23, 2022

Related U.S. Application Data

(60) Provisional application No. 63/128,898, filed on Dec. 22, 2020.

(51) Int. Cl.
G01R 1/073 (2006.01)
G01R 1/02 (2006.01)
G01R 1/04 (2006.01)
G01R 1/067 (2006.01)
G01R 31/28 (2006.01)

(52) U.S. Cl.
CPC ..... *G01R 1/07342* (2013.01); *G01R 31/2889* (2013.01)

(58) Field of Classification Search
CPC . G01R 1/02; G01R 1/04; G01R 1/067; G01R 1/073; G01R 31/02; G01R 31/28
See application file for complete search history.

(56) References Cited

U.S. PATENT DOCUMENTS

| | | | |
|---|---|---|---|
| 10,761,113 | B2 | 9/2020 | Maggioni |
| 11,035,883 | B2 | 6/2021 | Mochizuki et al. |
| 2006/0250150 | A1* | 11/2006 | Tunaboylu ......... G01R 1/07378 324/756.03 |
| 2008/0278188 | A1 | 11/2008 | Chung |
| 2012/0212248 | A9 | 8/2012 | Chong et al. |
| 2014/0028341 | A1* | 1/2014 | Mikuni ............. G01R 1/07307 324/756.03 |
| 2014/0253165 | A1 | 9/2014 | Kim et al. |

FOREIGN PATENT DOCUMENTS

| | | | |
|---|---|---|---|
| CN | 111060778 A | 4/2020 | |
| TW | 201116834 A | 5/2011 | |
| TW | 1416121 | * 11/2013 | ............. G01R 1/073 |
| TW | 201636623 A | 10/2016 | |
| TW | 201820575 A | 6/2018 | |
| WO | 2006/119405 A1 | 11/2006 | |

OTHER PUBLICATIONS

Chinese language office action dated Aug. 31, 2022, issued in application No. TW 110145412.

* cited by examiner

*Primary Examiner* — Neel D Shah

(74) *Attorney, Agent, or Firm* — McClure, Qualey & Rodack, LLP

(57) ABSTRACT

A probe card assembly includes a circuit board, a substrate, and at least one passive component. The substrate is disposed opposite and connected to the circuit board. The circuit board has a first opening facing the substrate and/or the substrate has a second opening facing the circuit board. The at least one passive component is disposed between the circuit board and the substrate and is at least partially accommodated in at least one of the first opening and the second opening.

18 Claims, 10 Drawing Sheets

PROBE CARD ASSEMBLY

CROSS REFERENCE TO RELATED APPLICATIONS

This application claims the benefit of U.S. Provisional Application No. 63/128,898 filed on Dec. 22, 2020, the entirety of which is incorporated by reference herein.

BACKGROUND

Field of the Disclosure

The present disclosure relates to a probe card assembly, and in particular, to a probe card assembly with one or more capacitors.

Description of the Related Art

Semiconductor devices can be applied in various fields, such as smart TVs, voice assistant devices (VAD), tablets, feature phones, smartphones, automotive electronics, 5G broadband, Wi-Fi 6, and so on. Steps for manufacturing semiconductor devices typically include sequentially depositing an insulation or dielectric layer, a conductive layer, and a semiconductor material layer on a semiconductor substrate, and patterning the various material layers by using lithography and etching technique to forming circuit components and elements on respective blocks of the semiconductor substrate. The circuit components and elements in conjunction with the respective blocks of the semiconductor substrate can be collectively referred to as semiconductor dies (or dice).

After the semiconductor dies are made, a wafer probe can be performed using a probe card assembly to test the functions, parameters, and electrical performance of the semiconductor dies. This procedure is also referred to as a wafer sort. Generally, one probe card assembly can be used to test a great number of different semiconductor dies. Accordingly, a stable and reliable probe card assembly is required for the accuracy and efficiency of those tests. Although existing probe card assemblies have been generally adequate for their intended purposes, they have not been entirely satisfactory in all respects

SUMMARY

An embodiment of the present disclosure provides a probe card assembly, which includes circuit board, a substrate, and at least one passive component. The substrate is disposed opposite and connected to the circuit board. The circuit board has a first opening facing the substrate and/or the substrate has a second opening facing the circuit board. The at least one passive component is disposed between the circuit board and the substrate and at least partially accommodated in at least one of the first opening and the second opening. The at least one passive component is at least partially accommodated in at least one of the first opening and the second opening.

Another embodiment of the present disclosure provides a probe card assembly, which includes a circuit board, a substrate, and at least one capacitor. The substrate is below the circuit board. The at least one capacitor is directly attached to the circuit board. The at least one capacitor is disposed corresponding to and partially received in a first opening on the bottom side of the circuit board, or a second opening on the top side of the substrate. The at least one capacitor is partially received in the first opening on the bottom side of the circuit board, or the second opening on the top side of the substrate.

Yet another embodiment of the present disclosure provides a probe card assembly, which includes a circuit board, a substrate, and at least one capacitor. The substrate is below the circuit board. The substrate is electrically connected to the circuit board. The at least one capacitor is directly attached to the substrate. The at least one capacitor is disposed corresponding to a first opening on the bottom side of the circuit board, or a second opening on the top side of the substrate. The at least one capacitor is partially received in the first opening on the bottom side of the circuit board, or the second opening on the top side of the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
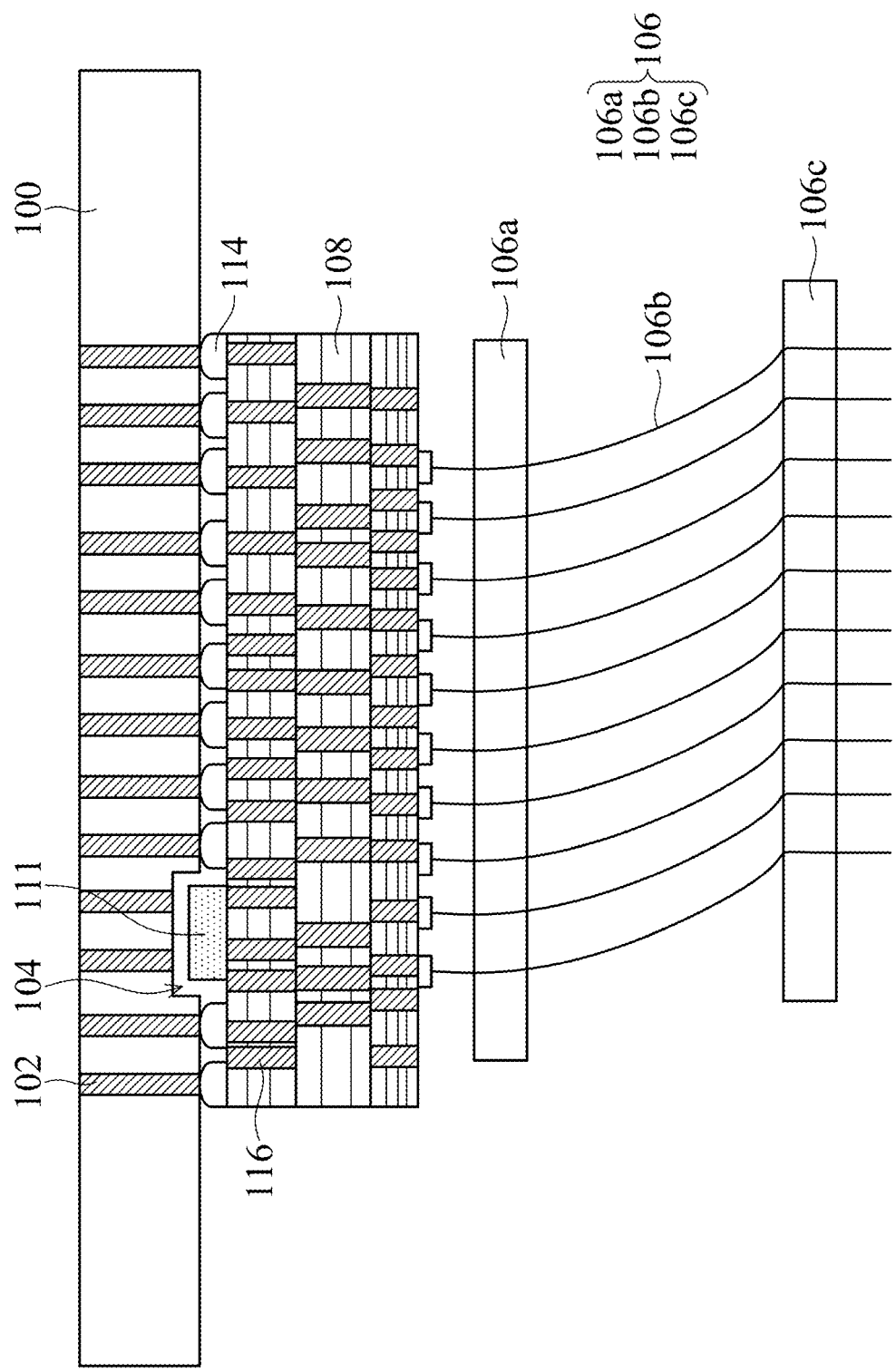
FIGS. 1-3 illustrate schematic cross-sectional views of probe card assemblies, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" include any method of direct and indirect electrical connection.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "roughly" typically mean±20% of the stated value, or ±10% of the stated value, or ±5% of the stated value, or ±3% of the stated value, or ±2% of the stated value, or ±1% of the stated value, or ±0.5% of the stated value. The stated value of the present disclosure is an approximate value. When there is no specific description, the stated value includes the meaning of "about", "approximately", and "roughly". The terminology used herein is for the purpose of describing particular embodiments only and is not intended to limit the invention. As used herein, the singular terms "a," "an" and "the" are intended to include the plural forms as well, unless the context clearly indicates otherwise.

Some embodiments of the disclosure are described below. The scope of the present disclosure is not limited to the features formed of the specific combinations of the following features, and should include other features formed of any combination of the following features or their equivalents. The described embodiments can be combined arbitrarily to form new embodiments, and all new embodiments are within the scope of the present disclosure.

The probe card assembly of the embodiments of the disclosure includes a circuit board and a substrate. At least one passive component is disposed between the circuit board and the substrate and at least partially accommodated in an opening of the circuit board and/or the substrate. This can provide design flexibility and process window to the probe card assembly. The at least one passive component may include a capacitor to mitigate or prevent IR drop of the probe card assembly.

FIG. 1 illustrates a schematic cross-sectional view of probe card assembly 10 in accordance with some embodiments of the present disclosure. The probe card assembly 10 may include a circuit board 100 and a substrate 108, as shown in FIG. 1. In some embodiments, the substrate 108 is disposed opposite to the circuit board 100 and is electrically connected to the circuit board 100. The substrate 108 may include a multilayer structure as shown in the figure.

In some embodiments, the material of the circuit board 100 and the material of the substrate 108 each includes but is not limited to bismaleimide triazine resin (BT resin), phenolic resin, composite epoxy, polyimide resin, glass fiber, another suitable insulation material, or a combination thereof. In some embodiments, the substrate 108 includes a plurality of wirings 118.

In some embodiments, the circuit board 100 has a first opening 104 that faces the substrate 108. A first passive component 111 is disposed between the circuit board 100 and the substrate 108, and the first passive component 111 is at least partially accommodated in the first opening 104. Specifically, the first passive component 111 is disposed corresponding to the first opening 104 on the bottom side of the circuit board 100, and the first passive component 111 is partially received in the first opening 104, in accordance with some embodiments. Since the first passive component 111 is at least partially accommodate in the opening 104, it allows the use of cheaper, large-sized passive component while ensuring that the probe card assembly is still compact in size. Note that in the embodiment of FIG. 1, the first passive component 111 is directly attached to an upper side of the substrate 108. Also note that the first opening 104 is provided between the overlapping area of the circuit board 100 and the substrate 108. That is, the first opening is not provided outside of the opposite edges of the substrate 108.

Generally, the design of the substrate 108 of a probe card assembly is sophisticated to allow lots of different semiconductor dies to be tested, and therefore, for the probe card assembly, it may be difficult to adjust the design of the substrate or the structure of the existing substrate. According to some embodiments of the present disclosure, the passive component at least partially accommodated in the opening of the circuit board 100 may provide a relatively simple method to modify the probe card assembly and/or to improve the performance of the probe card assembly. This may provide design flexibility to the probe card assembly and enhance the performance and reliability of the probe card assembly.

The circuit board 100 may be electrically connected to the substrate 108 through connection features 114. In some embodiments, the connection features 114 may include sold bumps or a copper pillars. In some embodiments, the first passive component 111 is between adjacent ones of the connection features 114. In some embodiments, the first passive component 111 is electrically connected to a conductive via (or conductive vias) 116 in the substrate 108.

The probe card assembly 10 may include a probe head 106 connected to the substrate 108. In some embodiments, the probe head 106 includes probes 106b penetrating through a first guide plate 106a and a second guide plate 106c. In some embodiments, the material of the first guide plate 106a and the second guide plate 106c include ceramic, plastic, or a combination thereof. The first guide plate 106a and/or the second guide plate 106c may be formed of composite material, in accordance with some embodiments.

Figure 2:
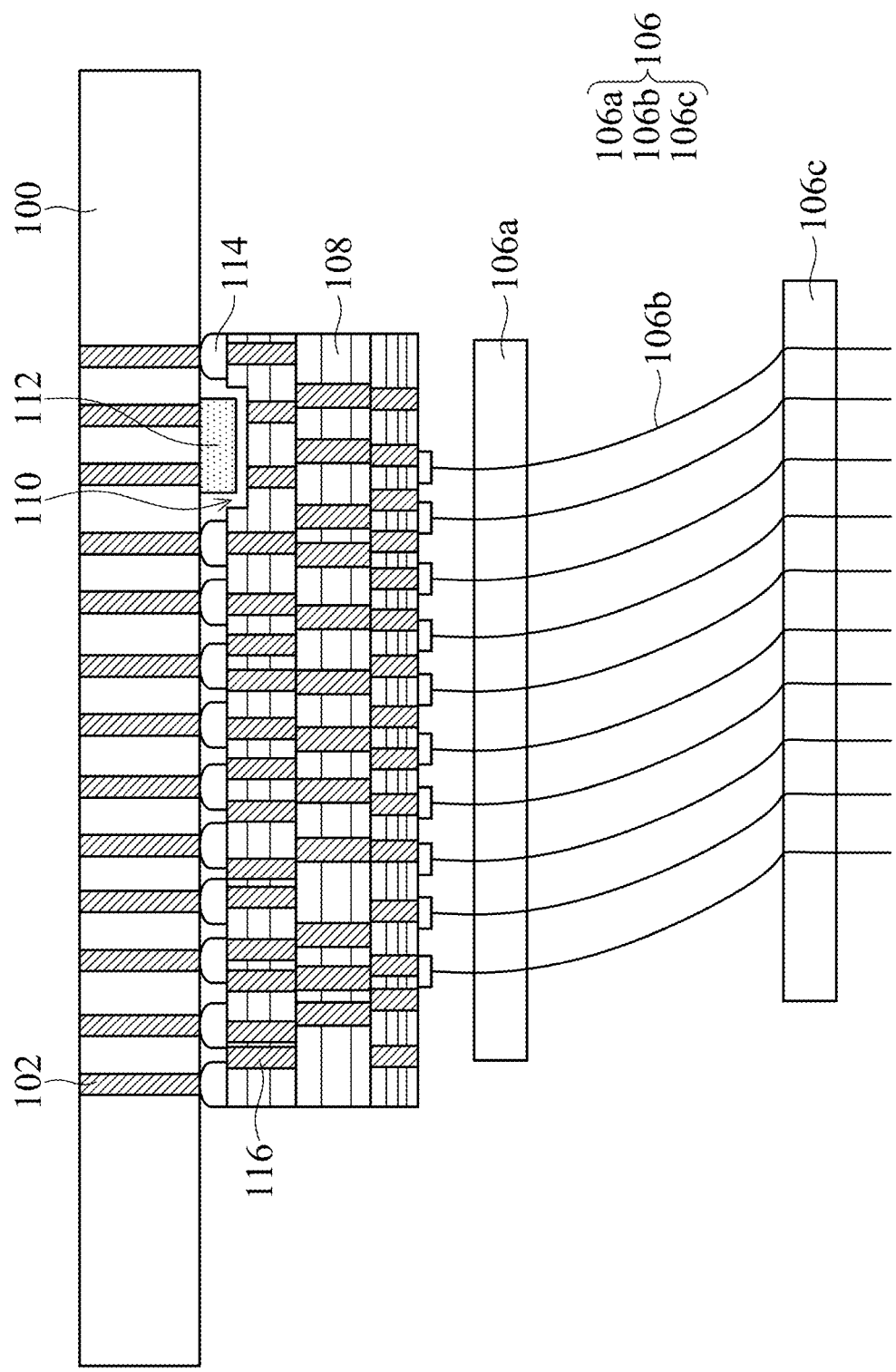

FIG. 2 illustrates a schematic cross-sectional view of probe card assembly 10 in accordance with some embodiments of the present disclosure. In some embodiments, the substrate 108 has a second opening 110 that faces the circuit board 100. A second passive component 112 is disposed between the circuit board 100 and the substrate 108, and the second passive component 112 is at least partially accommodated in second opening 110. Specifically, the second passive component 112 is disposed corresponding to the second opening 110 on the top side of the circuit substrate 108, and the second passive component 112 is partially received in the second opening 110, in accordance with some embodiments. In some embodiments, the second passive component 112 is electrically connected to a conductive via (or conductive vias) 102 in the circuit board 100 and extends into the second opening 110. Note that in the embodiment of FIG. 2, the second passive component 112 is directly attached to a lower side of the circuit board 100. The passive component at least partially accommodated in the opening of the substrate may provide design flexibility and enhance the performance and reliability of the probe card assembly.

Figure 3:
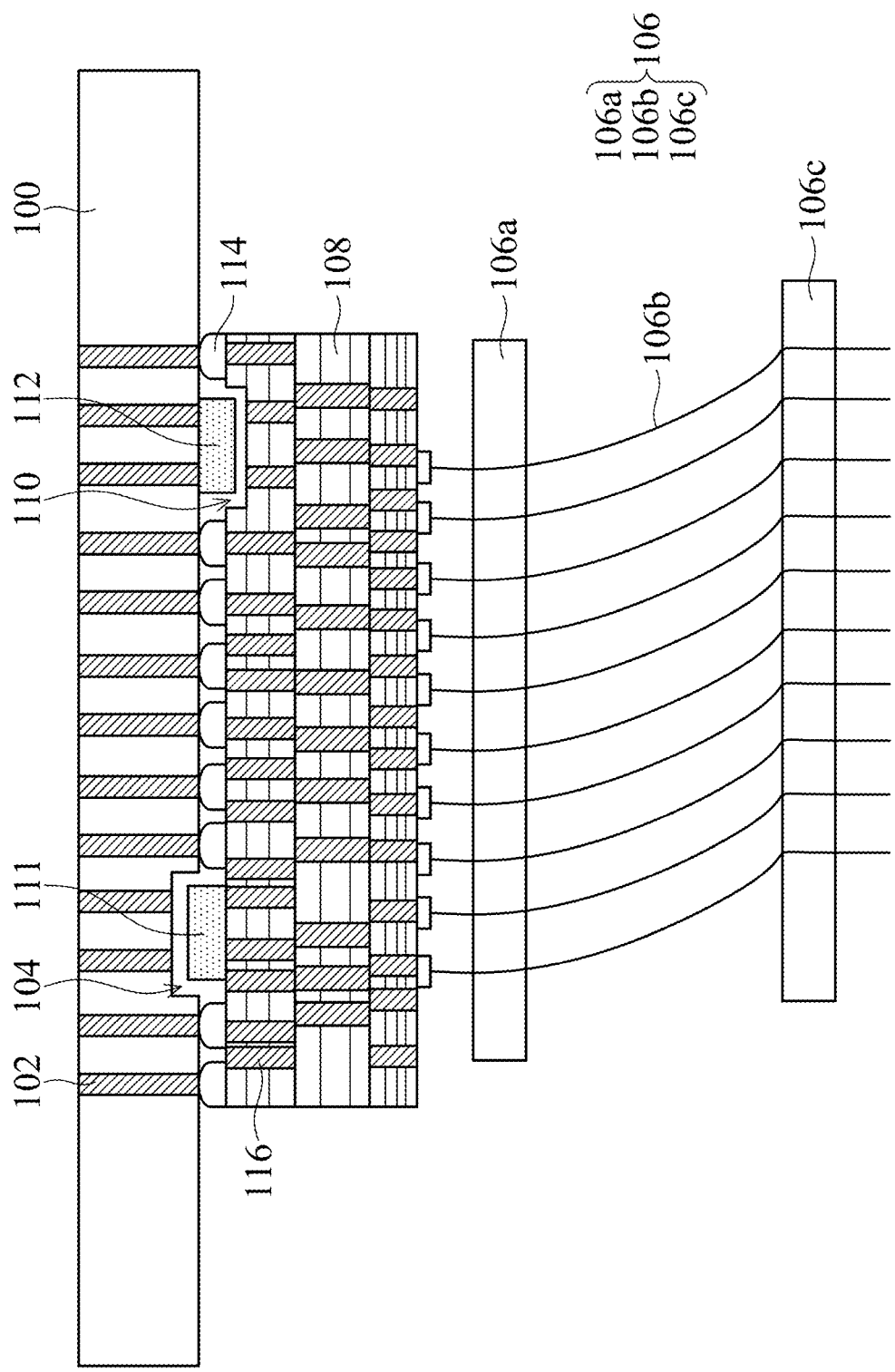

FIG. 3 illustrates a schematic cross-sectional view of probe card assembly 10 in accordance with some embodiments of the present disclosure. In some embodiments, the circuit board 100 has the first opening 104 that faces the substrate 108 and the substrate 108 has the second opening 110 that faces the circuit board 100. In some embodiments, the first passive component 111 and the second passive component 112 are disposed between the circuit board 100 and the substrate 108, and the first passive component 111 and the second passive component 112 are at least partially accommodated in the first opening 104 and the second opening 110 respectively.

In the embodiments of FIG. 3, the first passive component 111 is attached to the upper side of the substrate 108 and extends into the first opening 104, and the second passive component 112 is attached to the lower side of the circuit board 100 and extends into the second opening 110.

Figure 4:
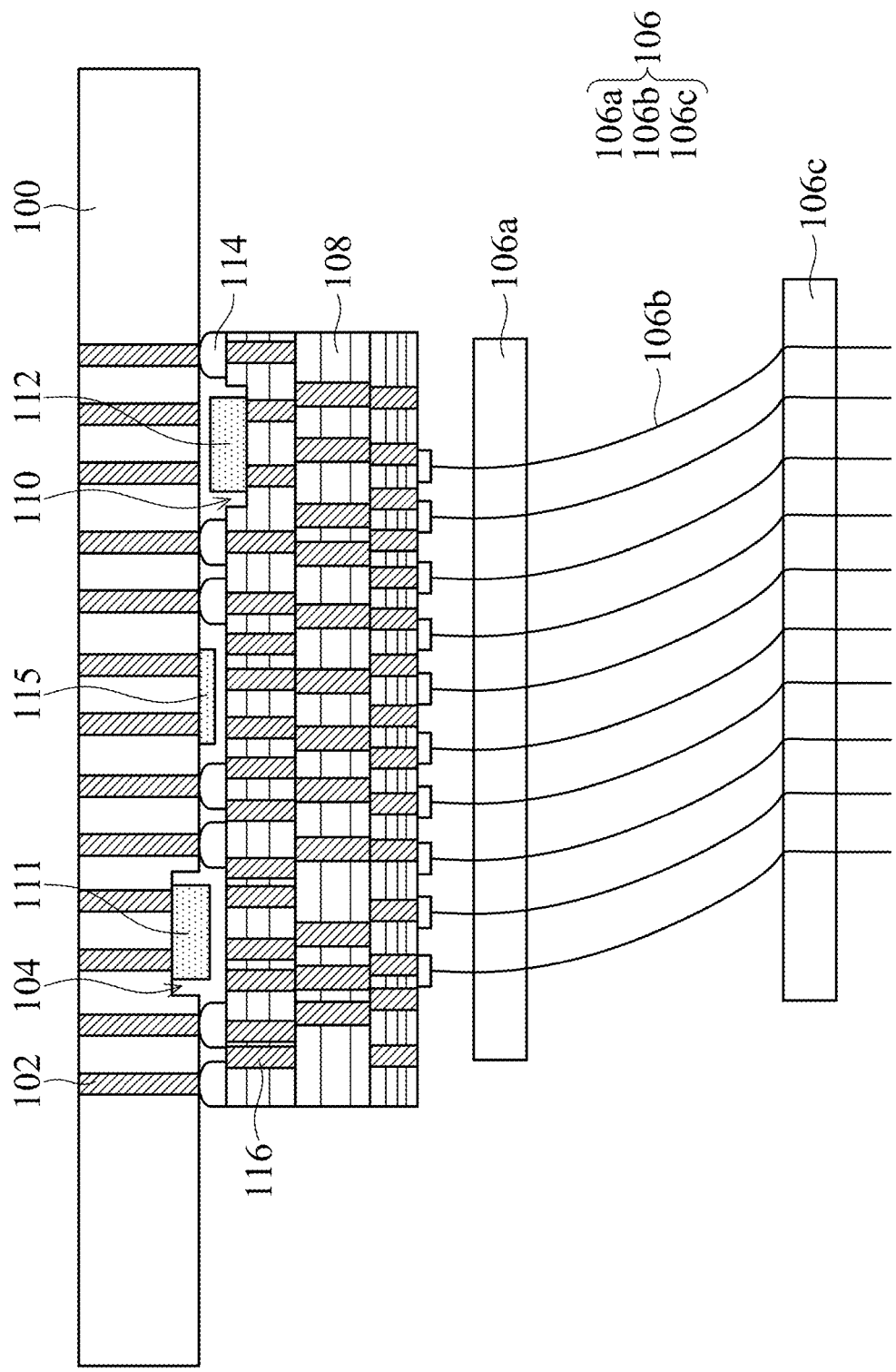
FIG. 4 illustrates a schematic cross-sectional view of a probe card assembly, in accordance with other embodiments of the present disclosure.

FIG. 4 illustrates a schematic cross-sectional view of a probe card assembly 10, in accordance with other embodiments of the present disclosure. As compared to FIG. 3, in the embodiments of FIG. 4, the first and second passive components 111 and 112 are directly attached to and received in the first and second openings 104 and 110, respectively. In other words, the portion of the first passive component 111 between the sidewalls of the first opening 104 is attached to the circuit board 100. Likewise, the portion of the second passive component 112 between the sidewalls of the second opening 110 is attached to the substrate 108. According to some embodiments of the present disclosure, each of the first passive component 111 and the second passive component 112 includes a capacitor, a resistor, an inductor, or a combination thereof.

In some embodiments, probe card assembly 10 further includes an additional passive component 115. The additional passive component 115 is also disposed between the circuit board 100 and the substrate 108. A thinner, expensive passive device may be used for the additional passive component 115 and it may not correspond to any one of the first opening 104 and the second opening 110 provided that it is sufficiently thin. In some embodiments, the additional passive component 115 includes a capacitor, a resistor, an inductor, or a combination thereof. According to the design or additional requirements of the probe card assembly 10, the additional passive component 115 may provide additional function and/or complementation to the probe card assembly 10.

The positions of the passive components can be modified to meet different requirements for the probe card assembly. FIGS. 5-8 illustrate schematic cross-sectional views of probe card assemblies with capacitors at varied positions between the circuit board and the substrate, in accordance with other embodiments of the present disclosure. Like features in FIGS. 1-4 and FIGS. 5-8 may be designated with like numerals and some of the description may not be repeated.

Figure 5:
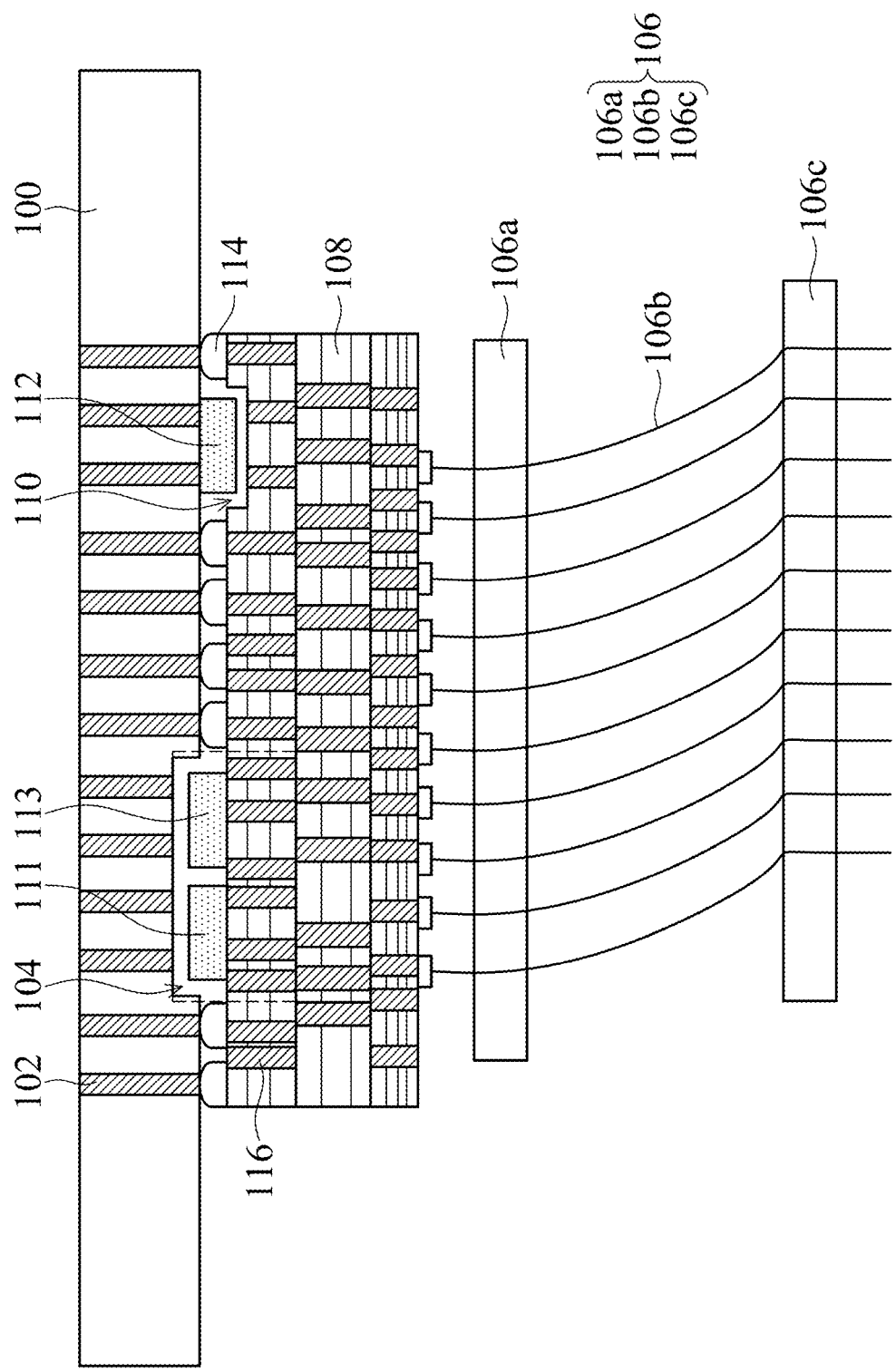
FIG. 5 illustrates a schematic cross-sectional view of a probe card assembly, in accordance with other embodiments of the present disclosure.

In the above embodiments, the opening and the passive component are designed as one-to-one correspondence. In other embodiments, the opening and the passive component are designed as one-to-many correspondence. Referring to FIG. 5, the first opening 104 is sufficiently large to accommodate more than one passive component. In particular, the probe card assembly 10 includes the first passive component 111, the second passive component 112, and the third passive component 113 disposed between the circuit board 100 and the substrate 108. The first passive component 111 and the third passive component 113 are both accommodated in the first opening 104 and electrically connected to the substrate 108. The second passive component 112 is accommodated in the second opening 110 and electrically connected to the circuit board 100. In some embodiments, the first passive component 111 and the third passive component 113 are attached to the substrate 108 and extend into the first opening 104. In some embodiments, the second passive component 112 is attached to the circuit board 100 and extends into the second opening 110.

Figure 6:
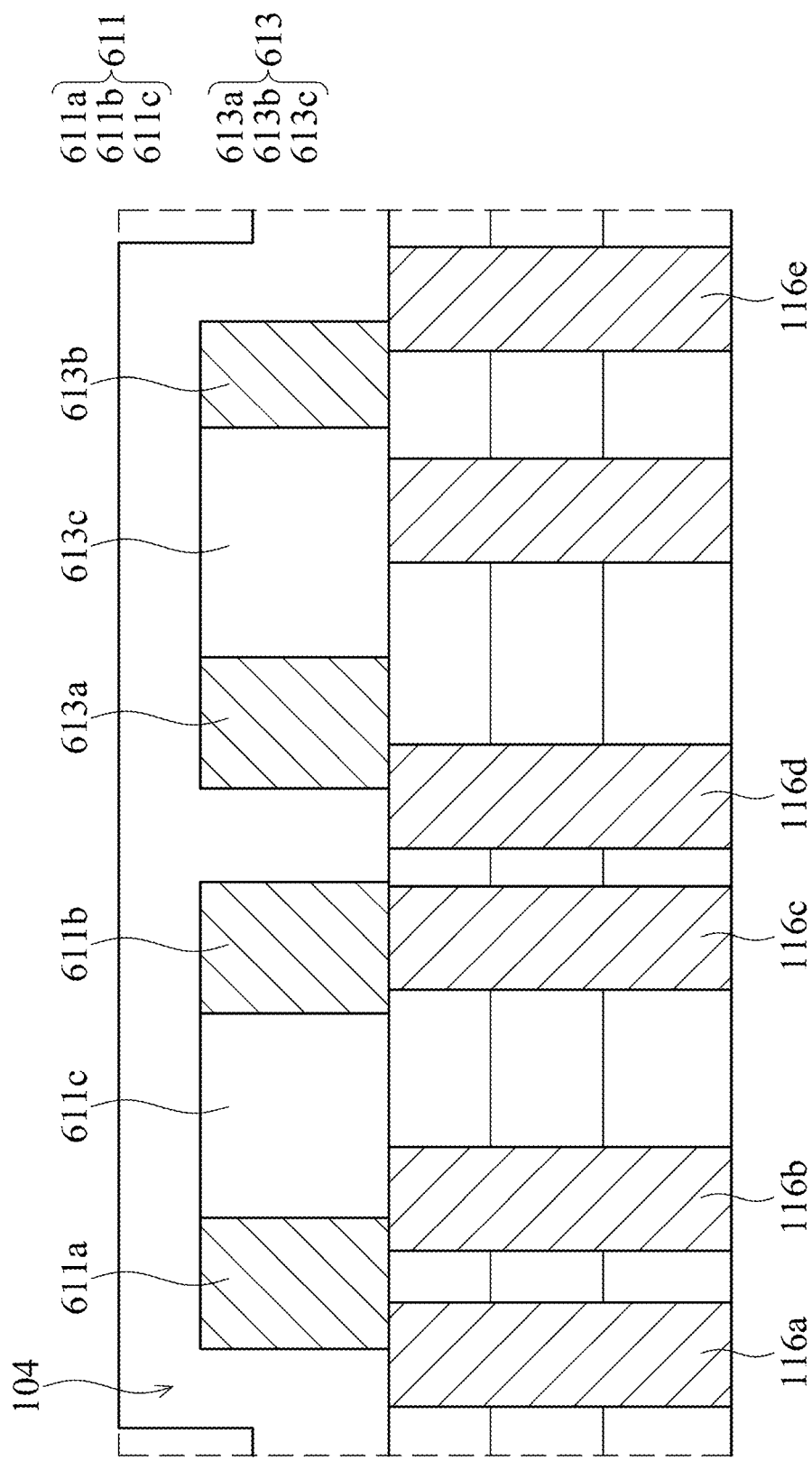
FIG. 6 illustrates an enlarged cross-sectional view of a probe card assembly, in accordance with some embodiments.

FIG. 6 illustrates an enlarged cross-sectional view of the dashed-rectangular region in FIG. 5, in accordance with some embodiments. In the embodiments of FIG. 6, the passive components are configured as capacitors. As shown in FIG. 6, the capacitor 611 includes electrodes 611a and 611b sandwiching a dielectric 611c. Similarly, the capacitor 613 includes electrodes 613a and 613b sandwiching a dielectric 613c. The material of the electrodes 611a, 611b, 613a, and 613b may each include a conductive material, such as metal, metal nitride, metal oxide, metal alloy, doped polysilicon, another suitable conductive material, or a combination thereof. For example, the metal may include Au, Ni, Pt, Pd, Ir, Ti, Cr, W, Al, Cu, or another suitable material; the metal nitride may include MoN, WN, TiN, TaN, TaSiN, TaCN, TiAlN, or another suitable material. The dielectrics 611c and 613c may each include semiconductor oxide, semiconductor nitride, semiconductor oxynitride, or another suitable dielectric material. According to the requirement and design of the probe card assembly, each electrode of the capacitors may be electrically connected to one or more conductive vias. For example, the electrode 611a is electrically connected to the conductive vias 116a and 116b, and the electrodes 611b, 613a, 613b are electrically connected to the conductive vias 116c, 116d, and 116e, respectively.

According to some embodiments of the present disclosure, the capacitors corresponding to the openings and electrically connected to the circuit board or the substrate of the probe card assembly may be used as decoupling/bypassing capacitors to mitigate or prevent IR drop (or voltage drop) of the probe card assembly, thereby enhancing the performance and reliability of the probe card assembly.

Figure 7:
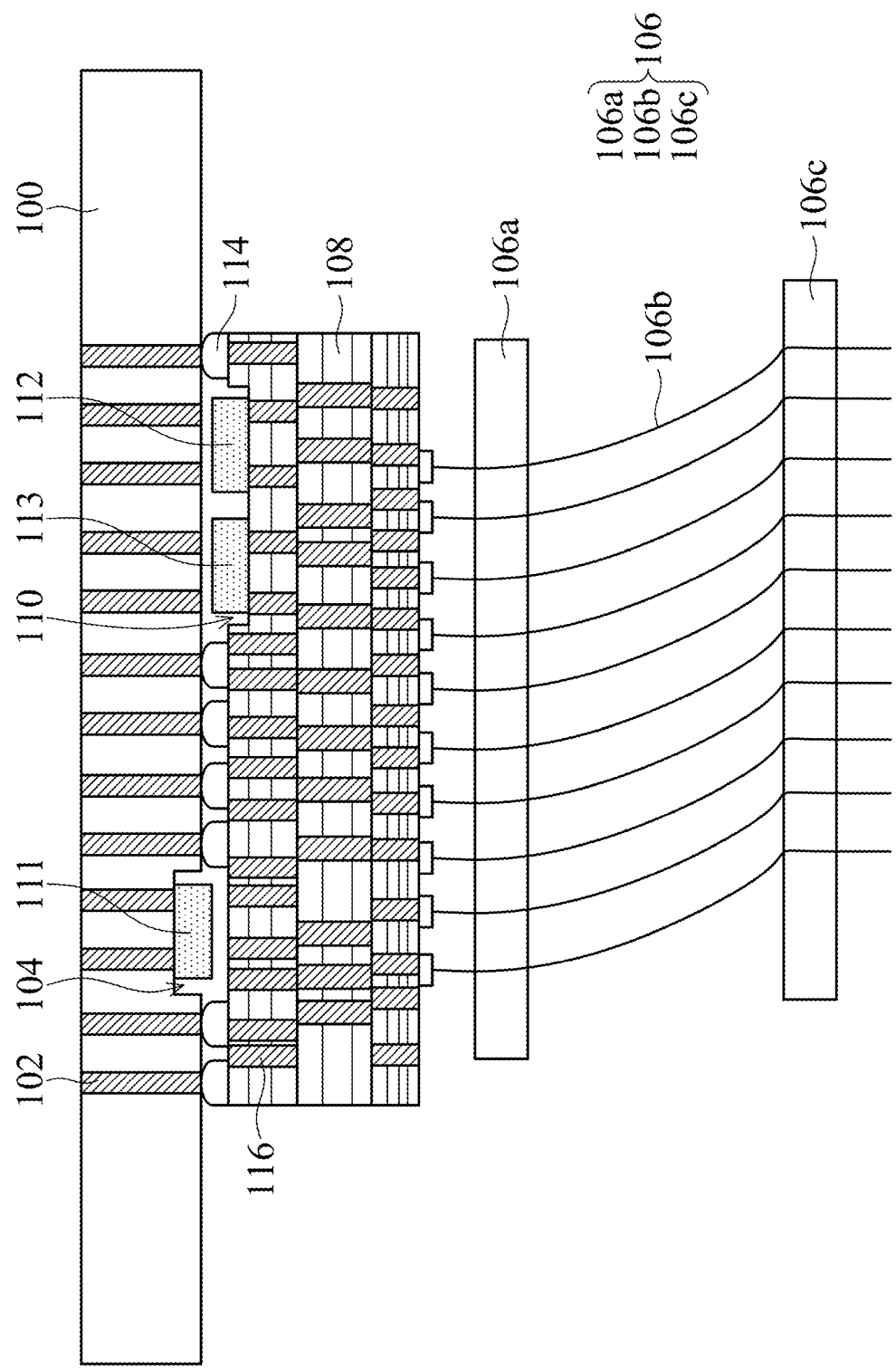
FIG. 7 illustrates a schematic cross-sectional view of a probe card assembly, in accordance with other embodiments of the present disclosure.

The embodiments of FIG. 7 are similar to that of FIG. 5 except the positions of the passive components. In particular, the portion of the second passive component 112 between the sidewalls of the second opening 110 and a portion of the third passive component 113 between the sidewalls of the second opening 110 are attached to the substrate 108, and the second passive component 112 and the third passive component 113 are electrically connected to the substrate 108. The first passive component 111 is electrically connected to the circuit board 100 and the portion of the first passive component 111 between the sidewalls of the first opening 104 is attached to the substrate 108. In some embodiments, the first passive component 111, the second passive component 112, and the third passive component 113 are between corresponding adjacent connection features 114.

Figure 8:
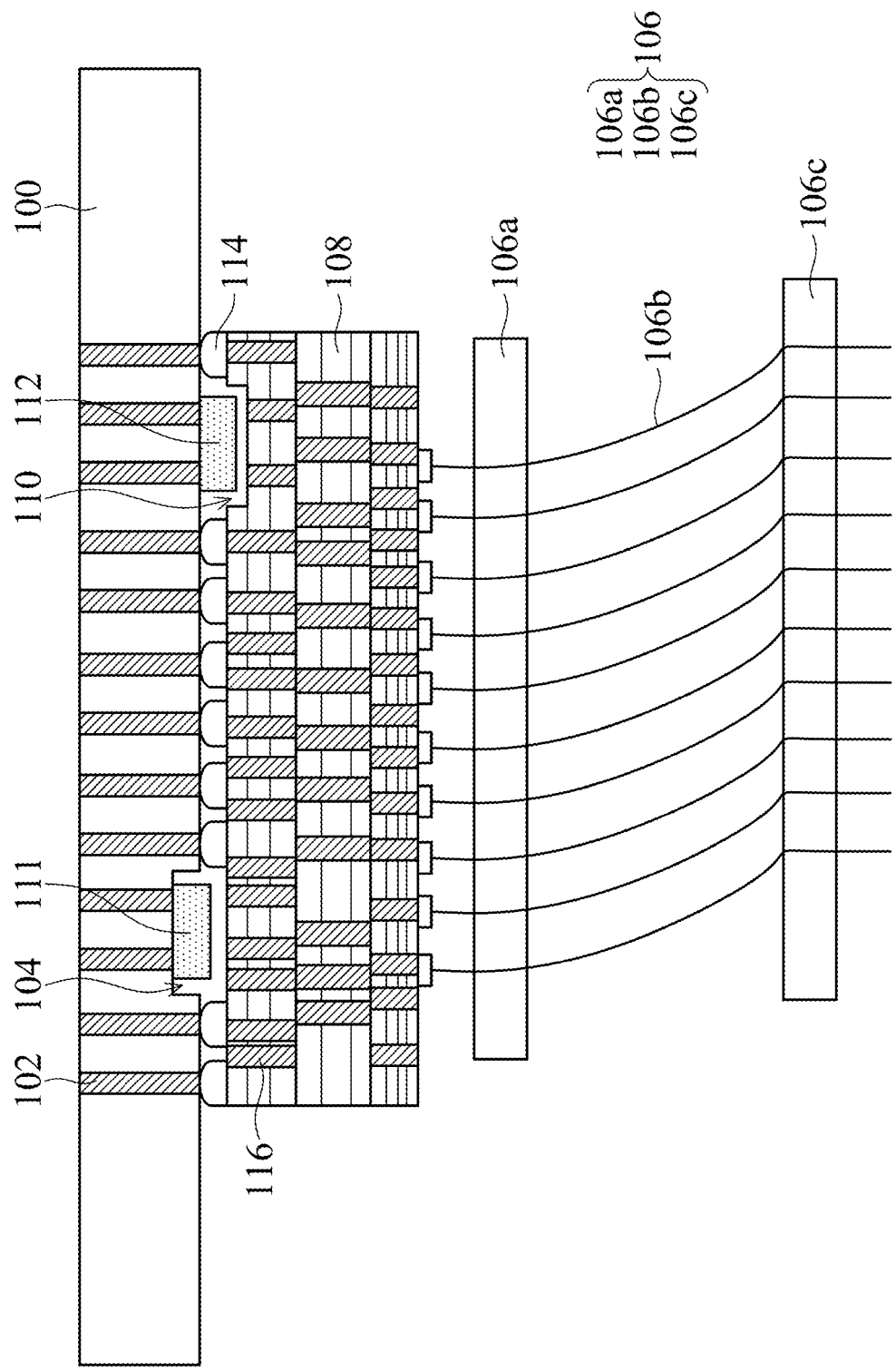
FIGS. 8 and 9 illustrate schematic cross-sectional views of probe card assemblies, in accordance with other embodiments of the present disclosure.

The embodiments of FIG. 8 are similar to that of FIG. 7 except the positions of the passive components. In particular, both the first passive component 111 and the second passive component 112 are directly attached to the circuit board 100, and the second passive component 112 extends into the second opening 110. Referring to FIG. 8, the first passive component 111 is electrically connected to a conductive via (or conductive vias) 102 in the circuit board 100 and extends below the bottommost surface of the circuit board 100. In some embodiments, the conductive via (or conductive vias)

102 extends from the top surface through the circuit board 100 and contacts the first passive component 111.

Referring to FIG. 8, the second passive component 112 is electrically connected to a conductive via (or conductive vias) 102 in the circuit board 100 and extends into the second opening 110. In some embodiments, the conductive via (or conductive vias) 102 extends from the top surface to the bottommost surface of the circuit board 100 and contacts the second passive component 112. In some embodiments where the probe card assembly 10 includes both the first passive component 111 and the second passive component 112, the first passive component 111 and the second passive component 112 are disposed on the same side of the circuit board 100.

Figure 9:
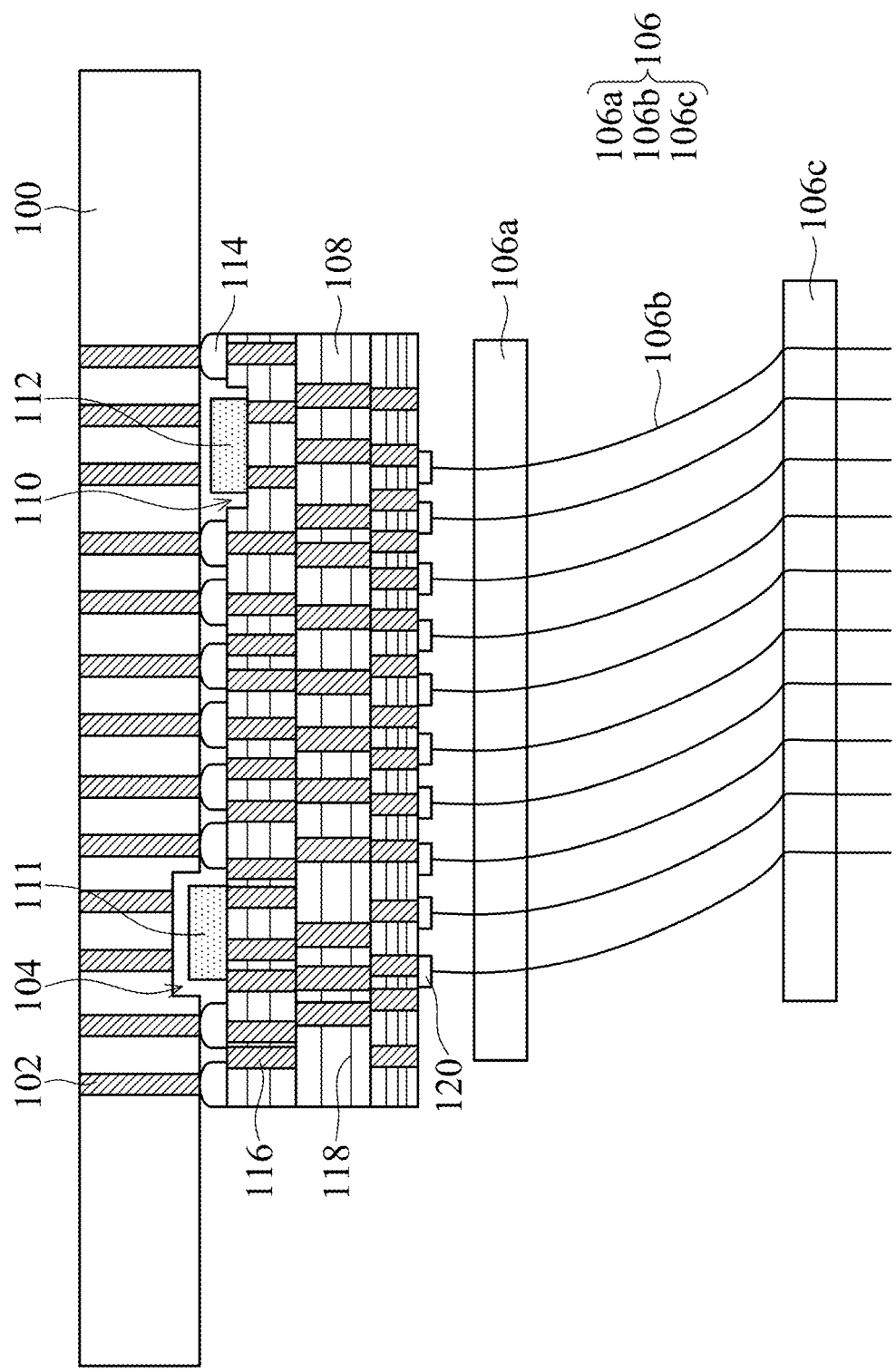

The embodiments of FIG. 9 are similar to that of FIG. 8 except the positions of the passive components. In particular, both the first passive component 111 and the second passive component 112 are directly attached to the substrate 108, and the first passive component 111 extends into the first opening 104. In some embodiments, the first passive component 111 is disposed corresponding to the first opening 104 on the bottom side of the circuit board 100, and the first passive component 111 is partially received in the first opening 104. Referring to FIG. 9, the first passive component 111 is electrically connected to a conductive via (or conductive vias) 116 in the substrate 108 and extends into the first opening 104. In some embodiments, the substrate 108 includes a plural sets of conductive vias 116 connecting respective layers in the substrate 108 or respective features of the probe card assembly 10.

Referring to FIG. 9, the second passive component 112 is disposed corresponding to the second opening 110 on the top side of the circuit substrate 108, and the second passive component 112 is partially received in the second opening 110. In some embodiments, the second passive component 112 is electrically connected to a conductive via (or conductive vias) 116 in the substrate 108 and extends above the topmost surface of the substrate 108. In some embodiments where the probe card assembly 10 includes both the first passive component 111 and the second passive component 112, the first passive component 111 and the second passive component 112 are disposed on the same side of the substrate 108. In some embodiments, the substrate 108 includes the plurality of wirings 118 connecting respective conductive vias 116 in the substrate 108. In some embodiments, the probes 106b of the probe head 106 are electrically connected to the connection pads 120 attached to the substrate 108. It should be noted that the number of capacitors corresponding to the respective opening is not limited. For example, there may be one, two, or more capacitors.

Figure 10:
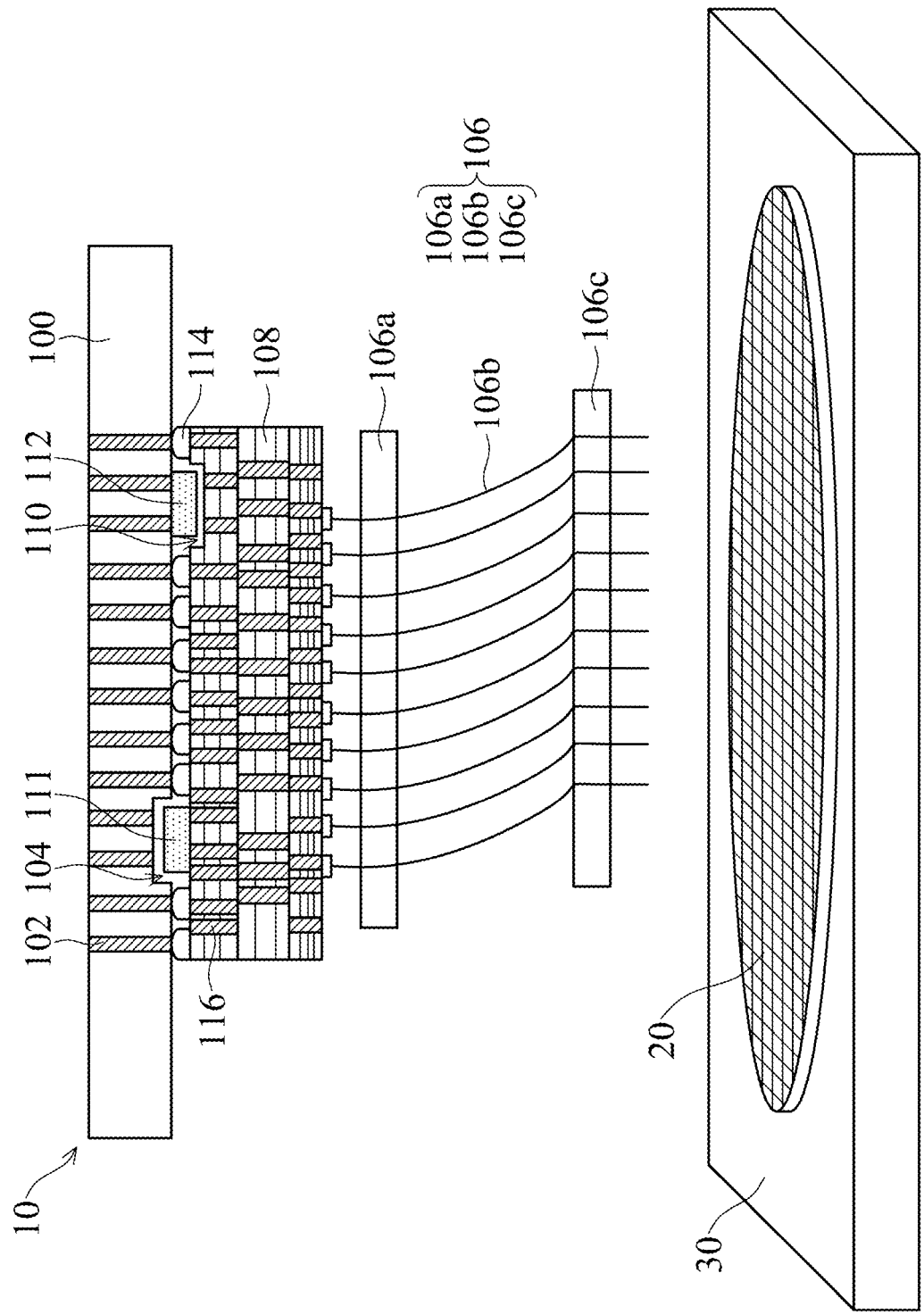
FIG. 10 illustrates a schematic view of a configuration of wafer probe, in accordance with some embodiments of the present disclosure.

FIG. 10 illustrates a schematic view of a configuration of wafer probe, in accordance with some embodiments of the present disclosure. The probe card assembly 10 in FIG. 10 includes the first passive component 111 that is attached to the substrate 108 and extends into the first opening 104 and the second passive component 112 that is attached to the circuit board 100 and extends into the second opening 110. As shown in FIG. 10, a wafer 20 is disposed on a prober chuck 30 and the probe card assembly 10 is above the wafer 20. During wafer probe, the probes 106b are controlled to contact respective dies of the wafer and to transmit signals between the probe card assembly 10 and the respective dies. The probe card assemblies in FIGS. 1-9 may also be applied to the configuration of wafer probe similar to that of FIG. 10.

The configuration of the probe card assemblies in the embodiments of the present disclosure may be utilized in semiconductor devices. For example, the substrate 108 may be an IC element (e.g. a memory, a graphics processing unit (GPU), a central processing unit (CPU), or a combination thereof) mounted on the circuit board 100, and the capacitor(s) disposed between the IC element 108 and the circuit board 100 and corresponding to the opening(s) may be used as decoupling/bypassing capacitor(s) to mitigate or prevent IR drop of the device and improve device performance.

The embodiments of the present disclosure provide many benefits to a probe card assembly. According to some embodiments of the present disclosure, the passive component(s) at least partially accommodated in the corresponding opening(s) of the circuit board and/or the substrate may provide design flexibility to the probe card assembly and enhance the performance and reliability of the probe card assembly. In addition, some embodiments of the present disclosure provide the probe card assembly with the capacitor(s) attached to the circuit board and/or the substrate and extending into the respective opening(s) of the circuit board and/or the substrate, thereby mitigating or preventing IR drop of the probe card assembly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe card assembly, comprising:
a circuit board;
a substrate disposed opposite and connected to the circuit board,
wherein the circuit board has a first opening facing the substrate and/or the substrate has a second opening facing the circuit board;
at least one passive component disposed between the circuit board and the substrate and at least partially accommodated in at least one of the first opening and the second opening, wherein the circuit board having a first surface opposite to the substrate and away from the at least one passive component, and wherein the first surface of the circuit board extends to cover the at least one passive component and is formed as a top surface of the probe card assembly;
connection features disposed between the circuit board and the substrate, each of the connection features has opposite sides respectively connected to a second surface of the circuit board and the substrate, wherein the second surface of the circuit board is located between the top surface and a bottom surface of the probe card assembly; and
a probe head connected to the substrate.

2. The probe card assembly as claimed in claim 1, wherein the at least one passive component is attached to the substrate and extends into the first opening.

3. The probe card assembly as claimed in claim 1, wherein the at least one passive component is attached to the circuit board and extends into the second opening.

4. The probe card assembly as claimed in claim 1, wherein a portion of the at least one passive component between sidewalls of the first opening is attached to the circuit board.

5. The probe card assembly as claimed in claim 1, wherein a portion of the at least one passive component between sidewalls of the second opening is attached to the substrate.

6. The probe card assembly as claimed in claim 5, further comprising an additional passive component disposed between the circuit board and the substrate and not corresponding to any one of the first opening and the second opening, wherein a thickness of the additional passive component is less than a thickness of the at least one passive component.

7. The probe card assembly as claimed in claim 6, wherein each of the at least one passive component and the additional passive component comprises a capacitor, a resistor, an inductor, or a combination thereof.

8. The probe card assembly as claimed in claim 1, wherein the at least one passive component comprises a first capacitor electrically connected to the substrate and a second capacitor electrically connected to the circuit board.

9. The probe card assembly as claimed in claim 8, wherein the at least one passive component further comprises a third capacitor disposed between the circuit board and the substrate, wherein the third capacitor is attached to the substrate and extends into the first opening.

10. The probe card assembly as claimed in claim 1, wherein the at least one passive component comprises a first capacitor electrically connected to the circuit board and a second capacitor electrically connected to the substrate.

11. The probe card assembly as claimed in claim 10, wherein the at least one passive component further comprises a third capacitor disposed between the circuit board and the substrate, wherein a portion of the third capacitor between sidewalls of the second opening is attached to the substrate.

12. The probe card assembly as claimed in claim 1, wherein the circuit board is electrically connected to the substrate through the connection features, and the at least one passive component is between adjacent ones of the connection features.

13. A probe card assembly, comprising:
a circuit board;
a substrate below the circuit board;
at least one capacitor directly attached to the circuit board, wherein the at least one capacitor is disposed corresponding to and partially received in a first opening on a bottom side of the circuit board, or a second opening on a top side of the substrate, wherein the circuit board having a first surface opposite to the substrate and away from the at least one capacitor, and wherein the first surface of the circuit board extends to cover the at least one capacitor and is formed as a top surface of the probe card assembly;
connection features disposed between the circuit board and the substrate, each of the connection features has opposite sides respectively connected to a second surface of the circuit board and the substrate, wherein the second surface of the circuit board is located between the top surface and a bottom surface of the probe card assembly; and
a probe head connected to the substrate.

14. The probe card assembly as claimed as claimed in claim 13, wherein the at least one capacitor is electrically connected to a conductive via in the circuit board and extends below a bottommost surface of the circuit board.

15. The probe card assembly as claimed in claim 13, wherein the substrate is electrically connected to the circuit board.

16. A probe card assembly, comprising:
a circuit board;
a substrate below and electrically connected to the circuit board;
at least one capacitor directly attached to the substrate;
wherein the at least one capacitor is disposed corresponding to and partially received in a first opening on a bottom side of the circuit board, or a second opening on a top side of the substrate, wherein the circuit board having a first surface opposite to the substrate and away from the at least one capacitor, and wherein the first surface of the circuit board extends to cover the at least one capacitor and is formed as a top surface of the probe card assembly;
connection features disposed between the circuit board and the substrate, each of the connection features has opposite sides respectively connected to a second surface of the circuit board and the substrate, wherein the second surface of the circuit board is located between the top surface and a bottom surface of the probe card assembly; and
a probe head connected to the substrate.

17. The probe card assembly as claimed as claimed in claim 16, wherein the at least one capacitor comprises a first capacitor electrically connected to a first conductive via in the substrate and extends into the first opening.

18. The probe card assembly as claimed in claim 17, wherein the at least one capacitor further comprises a second capacitor electrically connected to a second conductive via in the substrate and extends above a topmost surface of the substrate.

* * * * *